United States Patent
Tanikawa

(10) Patent No.: US 10,845,838 B2
(45) Date of Patent: Nov. 24, 2020

(54) REFERENCE VOLTAGE GENERATION CIRCUIT AND SEMICONDUCTOR DEVICE

(71) Applicant: LAPIS SEMICONDUCTOR CO., LTD., Kanagawa (JP)

(72) Inventor: Hiroyuki Tanikawa, Kanagawa (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 16/830,384

(22) Filed: Mar. 26, 2020

(65) Prior Publication Data
US 2020/0310481 A1    Oct. 1, 2020

(30) Foreign Application Priority Data

Mar. 29, 2019  (JP) ................................. 2019-067442

(51) Int. Cl.
  *G05F 3/24*  (2006.01)
  *G11C 5/14*  (2006.01)

(52) U.S. Cl.
  CPC ................ *G05F 3/24* (2013.01); *G11C 5/147* (2013.01)

(58) Field of Classification Search
  None
  See application file for complete search history.

(56) References Cited

U.S. PATENT DOCUMENTS

| 4,795,961 | A  | * | 1/1989 | Neidorff | G05F 3/30 |
| | | | | | 323/314 |
| 4,857,823 | A  | * | 8/1989 | Bitting | G05F 3/267 |
| | | | | | 323/314 |
| 8,237,425 | B1 | * | 8/2012 | Smith | G05F 1/575 |
| | | | | | 323/314 |
| 10,268,226 | B1 | * | 4/2019 | Wang | G05F 3/222 |
| 10,606,292 | B1 | * | 3/2020 | Lai | G05F 1/468 |
| 2013/0234692 | A1 | * | 9/2013 | Liang | G05F 3/02 |
| | | | | | 323/304 |

FOREIGN PATENT DOCUMENTS

JP    2004318604 A    11/2004

* cited by examiner

*Primary Examiner* — Jeffery S Zweizig
(74) *Attorney, Agent, or Firm* — Volentine, Whitt & Francos, PLLC

(57) ABSTRACT

A reference voltage generation circuit including: a first diode including a first conductive area; a second diode including a second conductive area that is larger than the first conductive area; a generation section configured to generate a reference voltage using a voltage based on the first diode and a voltage based on the second diode; and a first capacitor connected between a node of dividing resistors and an output of the generation section, the dividing resistors being connected between the output of the generation section and the second diode.

7 Claims, 8 Drawing Sheets

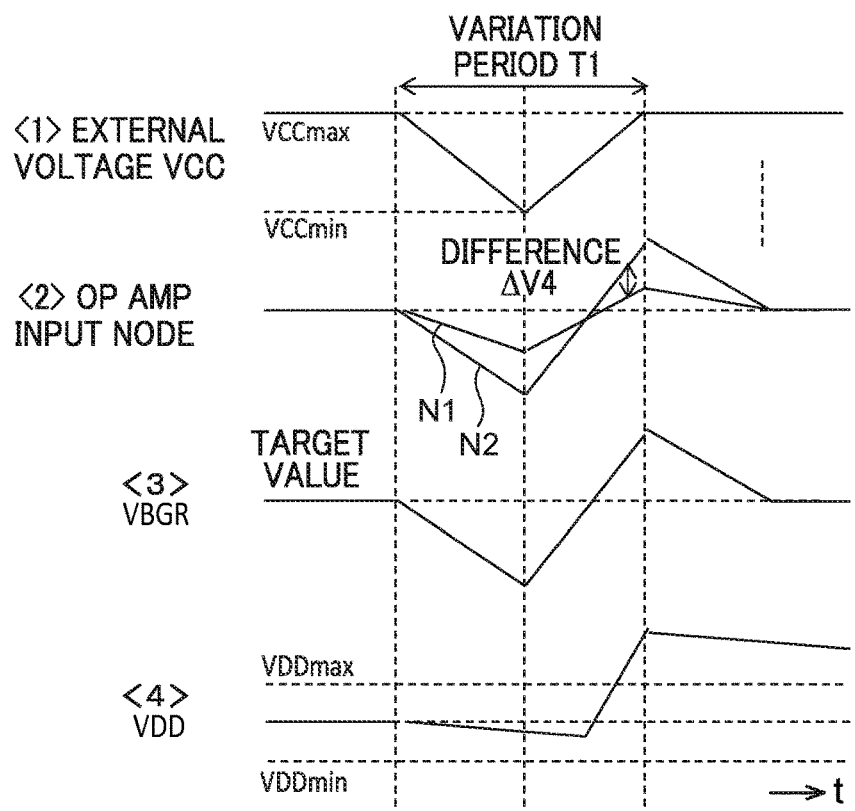
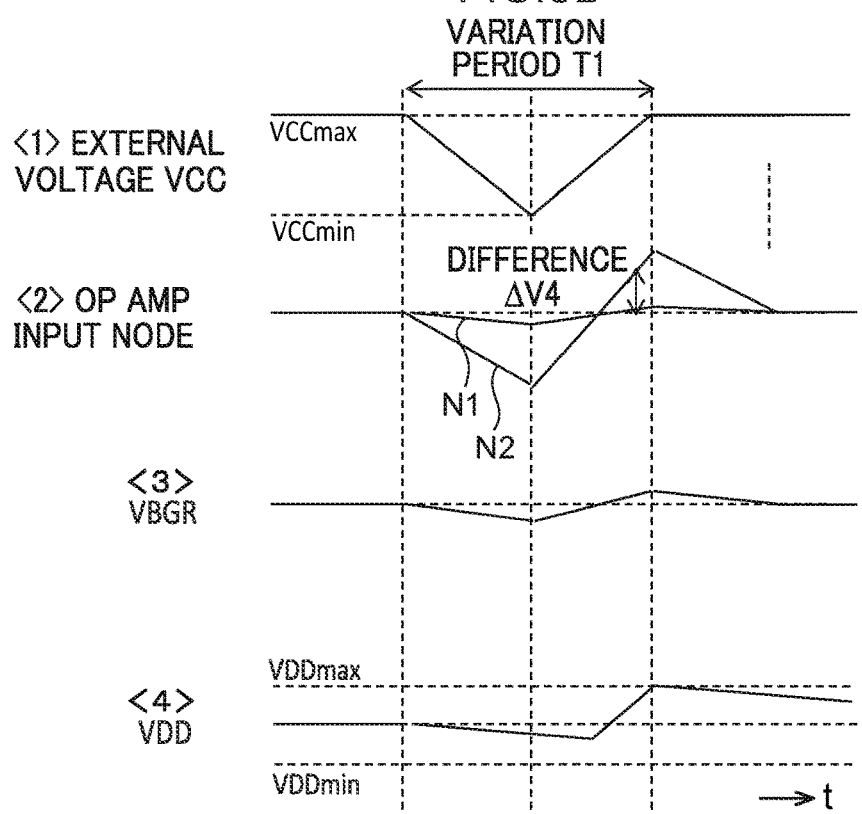

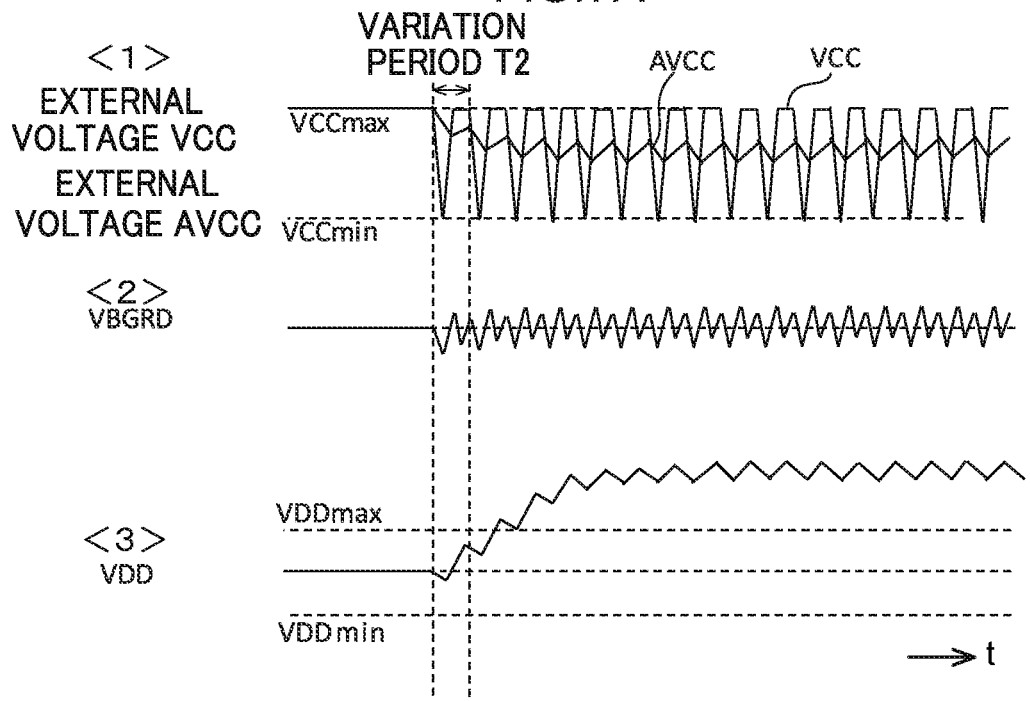
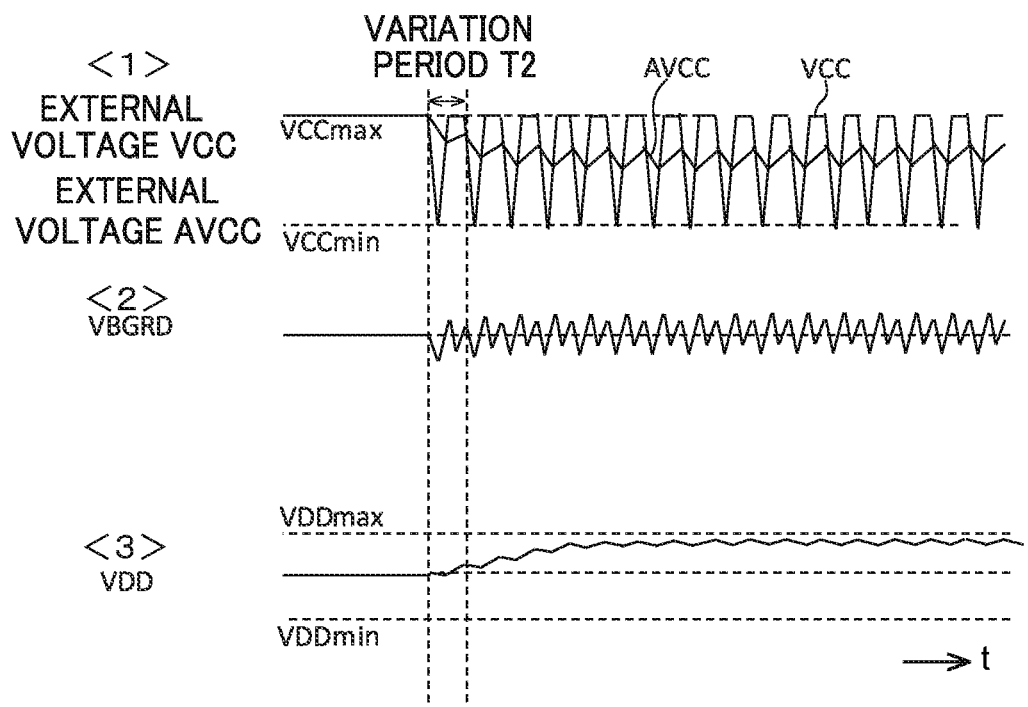

REFERENCE VOLTAGE GENERATION CIRCUIT AND SEMICONDUCTOR DEVICE

CROSS-REFERENCE TO RELATED APPLICATION

This application claims priority under 35 USC 119 from Japanese Patent Application No. 2019-067442, filed on Mar. 29, 2019, the disclosure of which is incorporated by reference herein.

BACKGROUND

Technical Field

The present disclosure relates to a reference voltage generation circuit and a semiconductor device.

Related Art

Heretofore, in order to meet the challenges of reducing power consumption in semiconductor devices, improving withstand voltages of oxide layers with the miniaturization of processes, stabilizing power supply voltages and so forth, an external power supply voltage is commonly stepped down to a required power supply voltage and this voltage is used in a semiconductor device (this may be referred to as "internal step-down" below). A circuit used for internal step-down is configured as a combination of a reference voltage circuit and a regulator circuit. The reference voltage circuit functions to supply a constant voltage even in a case in which variations in ambient temperature, fabrication processes, external power supply voltage and the like. The regulator circuit uses an output voltage of the reference voltage circuit as a reference voltage and generates a target internal step-down voltage. A bandgap circuit that is theoretically capable of very fine corrections of temperature dependency is commonly used.

As an example of a conventional semiconductor device that employs the bandgap circuit, FIG. 1 in Japanese Patent Application Laid-Open (JP-A) No. 2004-318604 discloses a start-up circuit. This start-up circuit is provided with: a P-channel MOS (metal oxide semiconductor) transistor (the term "PMOS" is used below) 1a that is connected to an inverted signal of a standby signal; a PMOS 1b that functions as a driver; npn-type bipolar transistors 1c and 1d that are differentially connected (the transistor 1c is constituted of X npn-type transistors); resistors 1g, 1h and 1i; an op amp 1e that outputs a reference voltage with a gain of 1, and an op amp 1f that differentially amplifies the outputs of the npn-type bipolar transistors 1c and 1d. In the start-up circuit disclosed in JP-A No. 2004-318604, a reference voltage that tolerates temperature variations and power supply variations may be generated from a bandgap using the npn-type bipolar transistors 1c and 1d.

However, in the above conventional bandgap circuit, in a case in which an external voltage varies transiently, the output voltage may fall due to capacitive coupling of the driver PMOS 1c, or the response of the differential amplification of the op amp 1f may not be able to track the variation, and the output voltage (that is, the reference voltage) may overshoot. In particular, if an external power supply has a wide voltage range, expected transient voltage variations of the external power supply are large, as a result of which variations in the output voltage (the reference voltage) are remarkable, and voltage variations of the regulator output for which this voltage is a reference voltage are large. As a result, the regulator output voltage (for example, a step-down voltage or internal voltage) may exceed a component withstand voltage of a component of a circuit being supplied with the step-down voltage (or internal voltage), or circuit operations of the circuit being supplied with this voltage may become troublesome. Furthermore, if a transient voltage variation of the external power supply is repeatedly applied, the output voltage of the bandgap circuit may repeatedly vary, the response of an amplifier of the regulator circuit may not be able to track the variations, and the output voltage may continuously rise.

SUMMARY

The present disclosure provides a reference voltage generation circuit and semiconductor device that may suppress variations in output voltage in a case in which an external voltage varies.

A first aspect of the present disclosure is a reference voltage generation circuit including: a first diode including a first conductive area; a second diode including a second conductive area that is larger than the first conductive area; a generation section configured to generate a reference voltage using a voltage based on the first diode and a voltage based on the second diode; and a first capacitor connected between a node of dividing resistors and an output of the generation section, the dividing resistors being connected between the output of the generation section and the second diode.

A second aspect of the present disclosure is a semiconductor device including: the reference voltage generation circuit according to the first aspect; a lowpass filter of which an input terminal is connected to an output of the reference voltage generation circuit; and a voltage conversion section connected to an output terminal of the lowpass filter, the voltage conversion section configured to convert and output a voltage of an external power supply on the basis of the reference voltage generated by the reference voltage generation circuit.

A third aspect of the present disclosure is a semiconductor device including: the reference voltage generation circuit according to the first aspect; and a voltage conversion section configured to convert and output a voltage of an external power supply on the basis of the reference voltage generated by the reference voltage generation section, the voltage conversion section including a comparison circuit that compares an output of the reference voltage generation circuit with an output of the voltage conversion section, and a second capacitor connected between the external power supply and an output of the comparison circuit.

According to the aspects described above, the reference voltage generation circuit and semiconductor device according to the present disclosure may suppress variations in output voltage in a case in which an external voltage varies.

BRIEF DESCRIPTION OF THE DRAWINGS

Exemplary embodiments will be described in detail based on the following figures, wherein:

FIG. 3A and FIG. 3B are timing diagrams illustrating operation waveforms of sections of the semiconductor device according to the first exemplary embodiment;

FIG. 7A and FIG. 7B are timing diagrams illustrating operation waveforms of sections of the semiconductor device according to the third exemplary embodiment.

DETAILED DESCRIPTION

Herebelow, exemplary embodiments for carrying out the present disclosure are described in detail with reference to the attached drawings. In the exemplary embodiments described below, a voltage converter circuit is described as an example of a semiconductor circuit according to the present disclosure, and a semiconductor memory device is described as an example of a semiconductor device including the voltage converter circuit. In the exemplary embodiments described below, a step-down circuit is described as an example of the voltage converter circuit.

First Exemplary Embodiment

Figure 1:
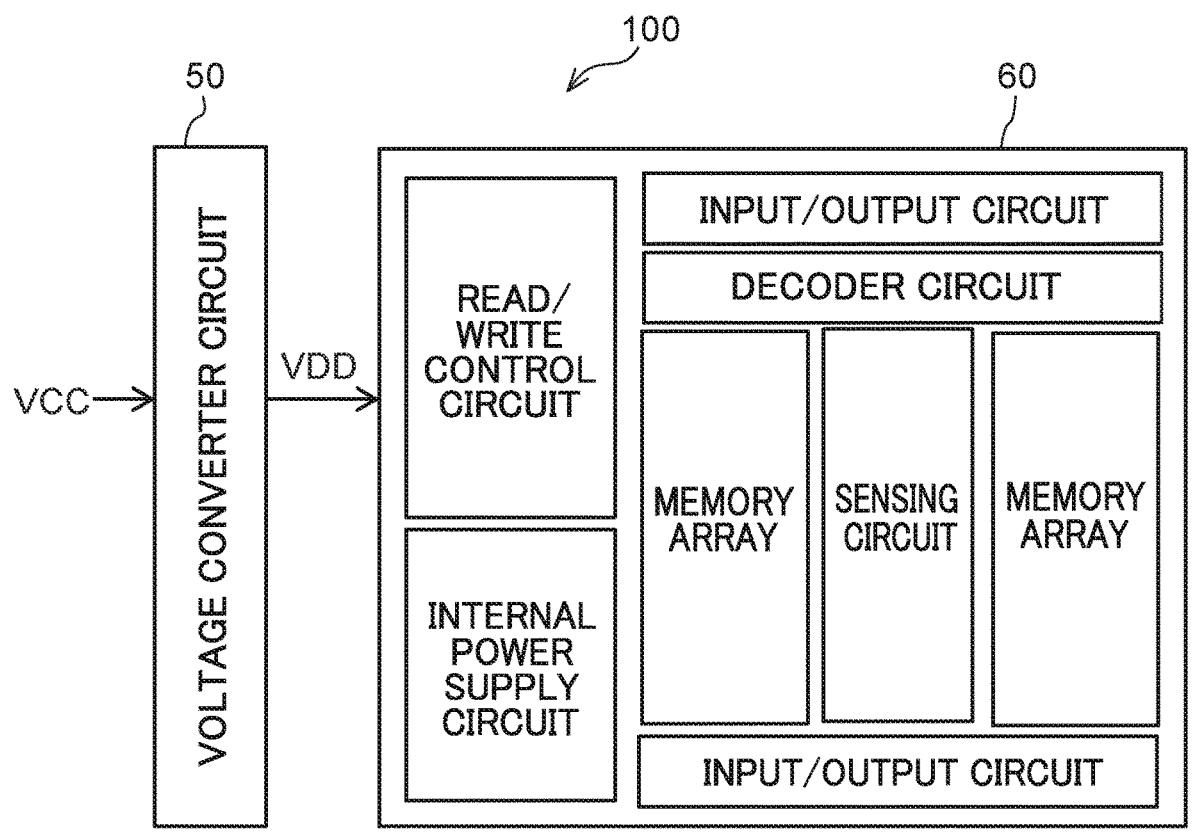
FIG. 1 is a block diagram illustrating configurations of a semiconductor memory device according to exemplary embodiments.

A reference voltage generation circuit and a semiconductor device according to the present exemplary embodiment are described with reference to FIG. 1 to FIG. 3B. FIG. 1 illustrates a semiconductor memory device 100 according to the present exemplary embodiment. As illustrated in FIG. 1, the semiconductor memory device 100 includes a semiconductor device 50 (labelled "voltage converter circuit" in FIG. 1), and an internal circuit 60. As illustrated in FIG. 1, the semiconductor device 50 is provided inside the semiconductor device together with the internal circuit 60. The semiconductor device 50 steps down an external power supply voltage VCC (which may be referred to below as "the external voltage VCC") to an internal power supply voltage VDD (which may be referred to below as "the internal voltage VDD"), and supplies the internal voltage VDD to the internal circuit 60. A reference voltage generation circuit according to the present exemplary embodiment is provided in the semiconductor device 50. As illustrated in FIG. 1, the internal circuit 60 according to the present exemplary embodiment is a memory circuit that includes, for example, a read/write control circuit, an internal power supply circuit, input/output circuits, a decoder circuit, memory arrays, a sensing circuit and so forth. The internal power supply circuit in the internal circuit 60 receives the internal voltage VDD from the semiconductor device 50 and distributes the voltage to the respective circuit blocks of the internal circuit 60 and the like. To give an example of the voltage values, the external voltage VCC is, for example, 3.3 V and the internal voltage VDD is, for example, 1.5 V.

Figure 2:
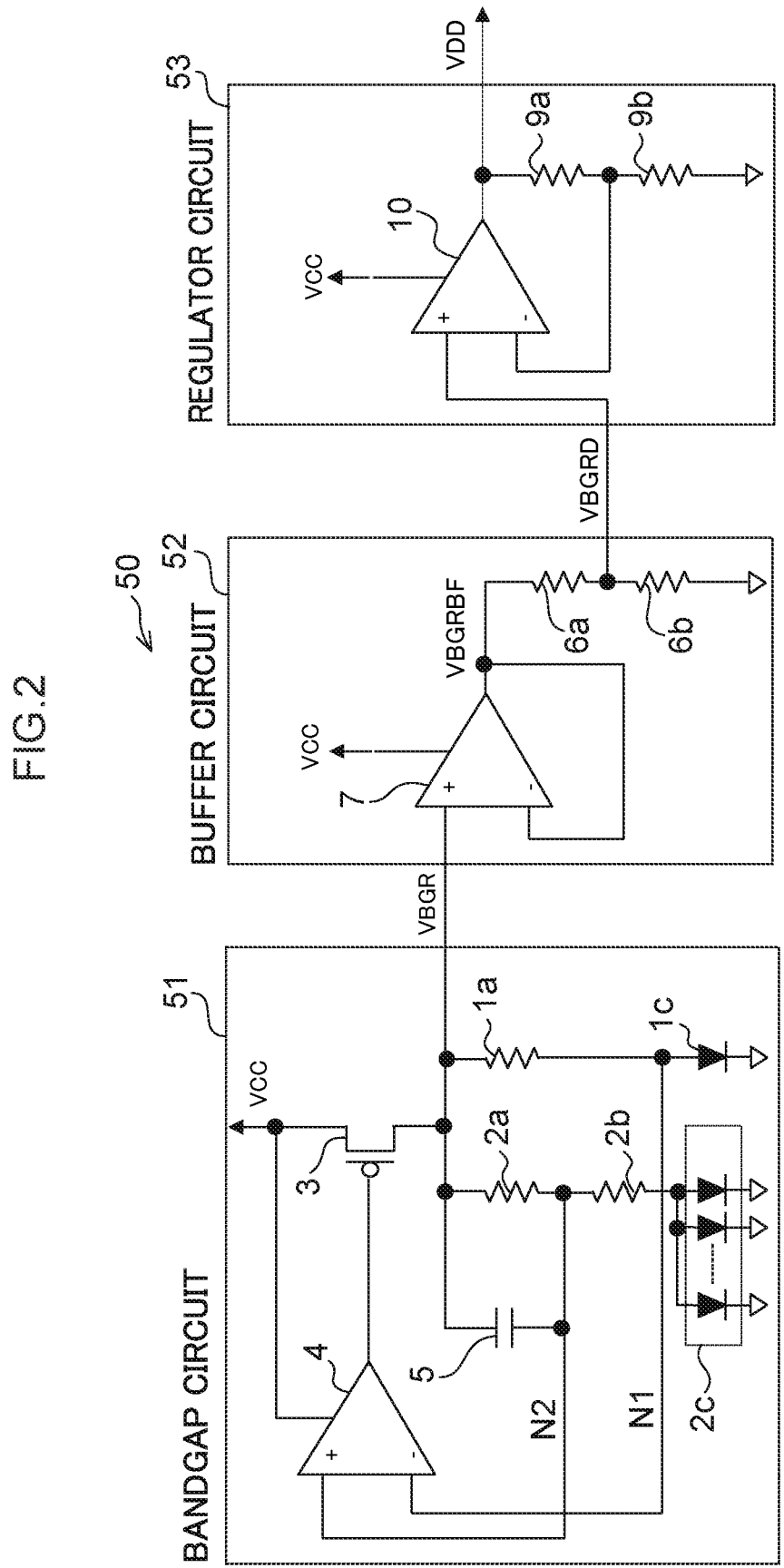
FIG. 2 is a circuit diagram illustrating configurations of a semiconductor device according to a first exemplary embodiment.

The semiconductor device 50 according to the present exemplary embodiment is described in detail with reference to FIG. 2. As illustrated in FIG. 2, the semiconductor device 50 includes a bandgap circuit 51, a buffer circuit 52 and a regulator circuit 53. The external voltage VCC is supplied to each of the bandgap circuit 51, the buffer circuit 52 and the regulator circuit 53. The bandgap circuit 51 is an example of the reference voltage generation circuit according to the present disclosure.

The bandgap circuit 51 is a circuit that generates a reference voltage VBGR to be used in the regulator circuit 53. As illustrated in FIG. 2, the bandgap circuit 51 is provided with an op amp 4, a driver 3, which is a PMOS, diodes 1c and 2c, resistors 1a, 2a and 2b, and a capacitor 5. As illustrated in FIG. 2, the diode 2c is configured by plural diodes being connected in parallel. The capacitor 5 is connected between the drain of the driver 3 and a connection point between the resistors 2a and 2b.

The buffer circuit 52 is provided with an op amp 7 and resistors 6a and 6b. The buffer circuit 52 generates a reference voltage VBGRBF that is buffered from the reference voltage VBGR, in order to suppress the effects of operation noise on the regulator circuit 53. The op amp 7 constitutes a unity gain amplifier. Therefore, the reference voltage VBGRBF is equivalent to the reference voltage VBGR. The reference voltage VBGRBF is divided between the resistors 6a and 6b, and supplied to the regulator circuit 53 as a reference voltage VBGRD. The buffer circuit 52 may be provided in a case in which there is particular concern about noise or the like, but is not necessarily required.

The regulator circuit 53 is provided with an op amp 10 and resistors 9a and 9b. For the purpose of outputting the internal voltage VDD, which is a step-down voltage, the op amp 10 uses the reference voltage VBGRD as a reference voltage, uses a feedback voltage in which the internal voltage VDD is divided by the resistors 9a and 9b as a comparison voltage, and compares the two voltages to control the internal voltage VDD.

In a case in which the diodes configuring the diode 2c are equivalent to eight of the diode 1c, the reference voltage VBGR, which is the output voltage of the bandgap circuit 51, can be expressed as illustrated below (Expression 1).

$$\text{VBGR} = (R2a/R2b) \times (kT/q) \times \ln(8 \times R2a/R1a) + VBE1 \quad (1)$$

Here, R1a denotes the resistor value of the resistor 1a, R2a denotes the resistor value of the resistor 2a, R2b denotes the resistor value of the resistor 2b, VBE1 denotes a voltage across the two terminals of the diode 1c, T denotes absolute temperature, and ln denotes a natural logarithm. A specific voltage value of the reference voltage VBGR is, for example, 1.2 V.

A temperature coefficient of the first term at the right side of Expression 1 has a positive value, and a temperature dependency of the second term at the right side (VBE1) has a negative value. Therefore, by adjusting the resistor values R1a, R2a and R2b such that the temperature coefficient of the first term at the right side matches the temperature dependency of the second term at the right side, adjustment is possible such that that the reference voltage VBGR has no temperature dependency, or such that the temperature dependency is within a tolerance range.

Although not specifically distinguished in FIG. 2, the external voltage VCC is divided between a VCC line for the bandgap circuit 51 and buffer circuit 52 and a VCC line for the regulator circuit 53, such that the regulator circuit 53 is not affected by operation noise. This division can be implemented by connecting the respective VCC lines to separate power supply pads. In order to moderate voltage variations of the external voltage VCC over relatively short periods, a lowpass filter may be added to the VCC line preceding the bandgap circuit 51 and buffer circuit 52. The division between the VCC line for the bandgap circuit 51 and buffer circuit 52 and the VCC line for the regulator circuit 53 may be implemented as necessary in consideration of the effects of noise and the like, but is not a required configuration.

Now, operation of the semiconductor device 50 is described with reference to FIG. 3A and FIG. 3B. FIG. 3A and FIG. 3B are timing diagrams illustrating operation waveforms of sections of the semiconductor device 50 in response to a variation of the external voltage VCC. FIG. 3A depicts a situation in which the capacitor 5 illustrated in FIG. 2 is omitted, and FIG. 3B depicts a situation in which the capacitor 5 is present. FIG. 3A and FIG. 3B each illustrate <1> a waveform of the external voltage VCC, <2> waveforms at input nodes of the op amp 4 (that is, node N1 and node N2 illustrated in FIG. 2), <3> a waveform of the reference voltage VBGR, and <4> a waveform of the internal voltage VDD. As illustrated by waveform <1> in FIG. 3A and FIG. 3B, in the present example a voltage variation with a relatively long duration of a variation period T1 occurs in the external voltage VCC (for example, T1 is a period of about 2 μs (microseconds)). A variation range of the external voltage VCC is a range between VCCmin and VCCmax.

As illustrated by waveform <2> in FIG. 3A, in a case in which the external voltage VCC falls, the voltages at the nodes N1 and N2 that are the inputs of the op amp 4 fall at rates according to the resistor value of the resistor 1a and the resistor value of the resistor 2a. The driver 3, which is a PMOS, is turned ON by a difference between the voltage at node N1 and the voltage at node N2, and the reference voltage VBGR also falls. Hence, in a case in which the external voltage VCC rises, a rise in the gate voltage of the driver 3 that is a PMOS is delayed by a delay in the response of the op amp 4. Therefore, the reference voltage VBGR rises rapidly.

Because the driver 3 is still ON in a case in which the node N1 and the node N2 are at equal voltage, the reference voltage VBGR continues to rise in conjunction with the external voltage VCC. In a case in which the rise of the external voltage VCC stops, the rise of the reference voltage VBGR also stops and the driver 3 is turned OFF by the difference between the voltage at node N1 and the voltage at node N2 (the difference ΔV4 illustrated in FIG. 3A and FIG. 3B). In a case in which the driver 3 turns OFF, discharge occurs by current paths through the resistor 1a and the resistor 2a, and the reference voltage VBGR falls to the target value thereof.

In general, the regulator circuit 53 would often be designed with small discharge capability in order to suppress power consumption. Accordingly, in a case in which the reference voltage VBGR falls, the internal voltage VDD that is the output of the regulator circuit 53 only discharges a little through the path of the resistors 9a and 9b and, as illustrated by waveform <4> in FIG. 3A, the voltage drop is small. Hence, in a case in which the reference voltage VBGR rises and the op amp 10 operates, charge is supplied from a driver (not illustrated in the drawings) of the op amp 10 that has a high current supply capability, and the internal voltage VDD rises rapidly as illustrated by waveform <4> in FIG. 3A.

In a case in which the reference voltage VBGR starts to fall again, the driver (not illustrated in the drawings) of the op amp 10 stops, the internal voltage VDD node discharges through the path of the resistors 9a and 9b, and the internal voltage VDD approaches the target value thereof. The greater the maximum value of a variation of the reference voltage VBGR, the greater an overshoot of the internal voltage VDD. As a result of the operations described above, the internal voltage VDD varies into a range exceeding VDDmax. Here, VDDmin denotes a minimum target value and VDDmax denotes a maximum target value of the internal voltage VDD. The term "overshoot" of the internal voltage VDD refers to an amount by which the internal voltage VDD oscillates beyond VDDmax in waveform <4> of FIG. 3A.

In contrast, in a case in which the capacitor 5 is present, variations of the reference voltage VBGR are stabilized by operation of the capacitor 5 and, as illustrated by waveform <2> in FIG. 3B, the voltage variation at node N1 is suppressed but the voltage variation at node N2 is not greatly altered. Thus, the difference ΔV4 that is the potential difference between node N1 and node N2 is assuredly large, the differential amplification function of the op amp 4 is enhanced, and the oscillation of the reference voltage VBGR is suppressed. Because the oscillation in the reference voltage VBGR is suppressed, an overshoot of the internal voltage VDD that is the output of the regulator circuit 53 is moderated (the overshoot is kept below VDDmax).

As is described in detail above, according to the reference voltage generation circuit and semiconductor device according to the present exemplary embodiment, because of the provision of the capacitor 5, the reference voltage VBGR may be stabilized and amplification gain of the op amp 4 may be improved at the same time. Consequently, an output variation of the internal voltage VDD that is the output of the regulator circuit 53 may be kept within a target voltage range.

Second Exemplary Embodiment

Figure 4A:
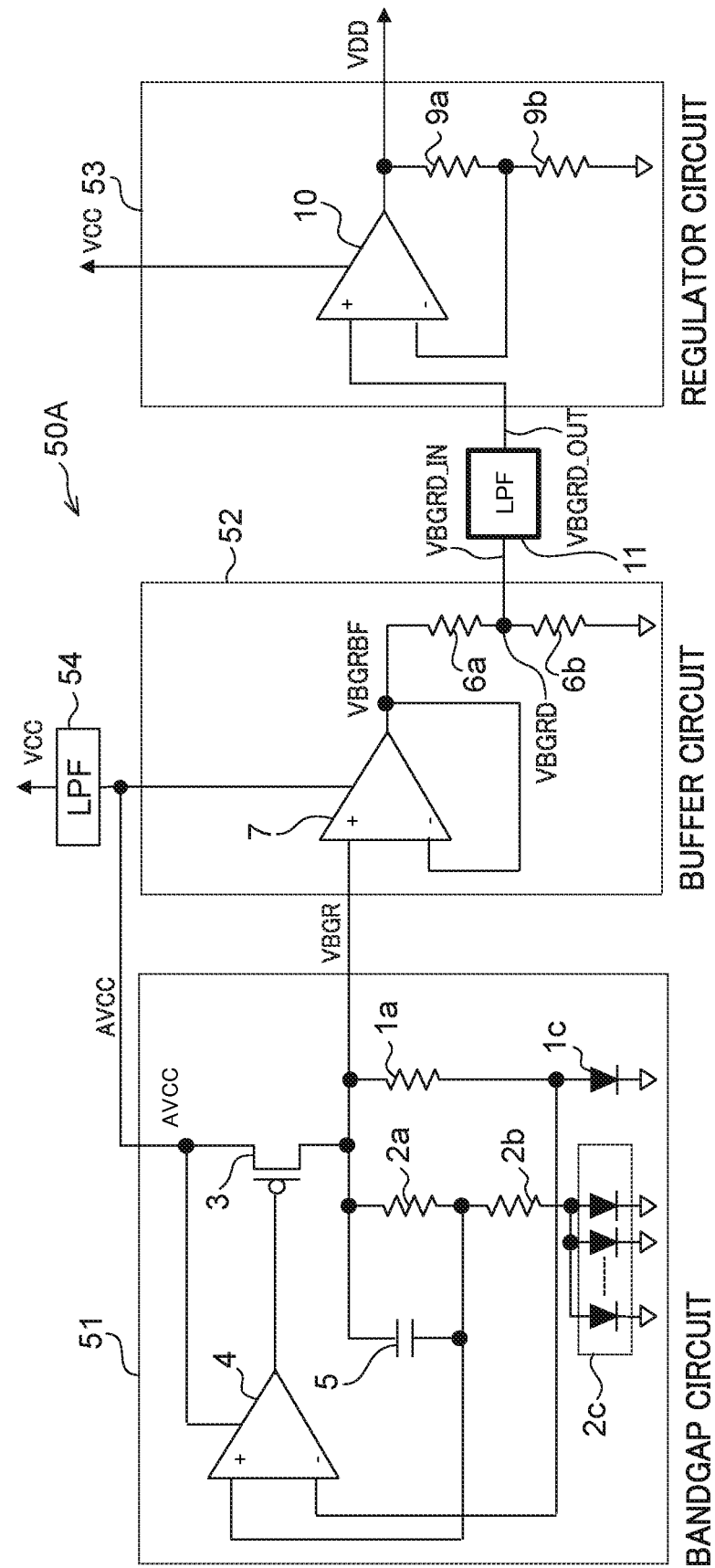
FIG. 4A and FIG. 4B are circuit diagrams illustrating configurations of a semiconductor device according to a second exemplary embodiment.

A semiconductor device according to the present exemplary embodiment is described with reference to FIG. 4A, FIG. 4B, FIG. 5A and FIG. 5B. As illustrated in FIG. 4A, in a semiconductor device 50A according to the present exemplary embodiment, a lowpass filter 11 (labelled "LPF" in FIG. 4A) is added to the semiconductor device 50 according to the exemplary embodiment described above. The lowpass filter 11 is applied to a reference voltage VBGRD, which is the output voltage of the buffer circuit 52. In addition, a lowpass filter 54 for removing noise is applied to the external voltage VCC. An external voltage AVCC, which is the voltage after passing through the lowpass filter 54, is supplied to both the bandgap circuit 51 and the buffer circuit 52. Other configurations are the same as in the semiconductor device 50. Configurations that are the same are assigned the same reference symbols and detailed explanations thereof are omitted. An external voltage AVCC may also be supplied to the regulator circuit 53.

Figure 4B:
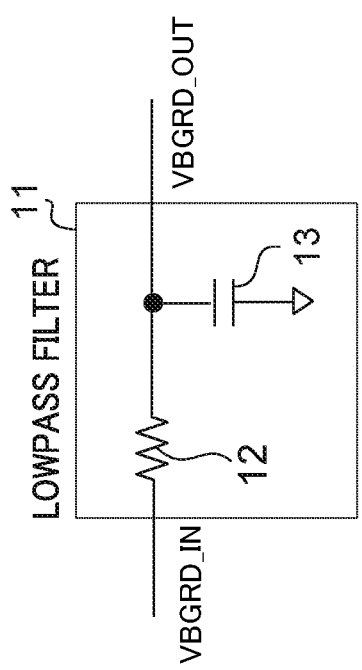

FIG. 4B illustrates an example configuration of the lowpass filter 11. As illustrated in FIG. 4B, the lowpass filter 11 is an integrating circuit provided with a resistor 12 and a capacitor 13, and is provided with an input terminal VBGRD_IN and an output terminal VBGRD_OUT.

Figure 5A:
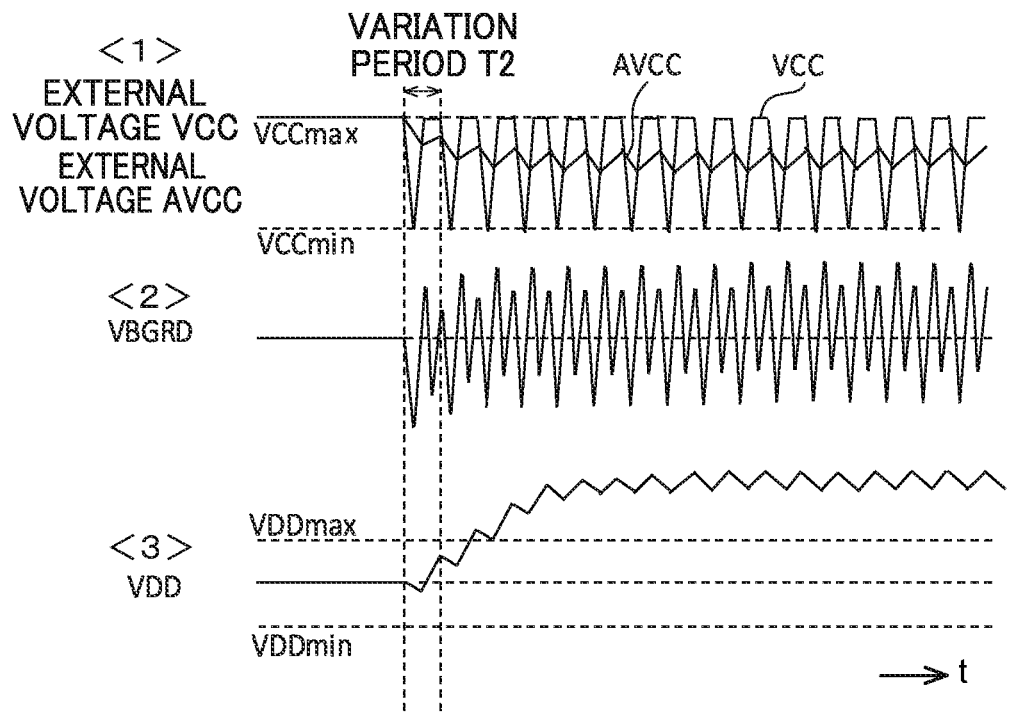
FIG. 5A and FIG. 5B are timing diagrams illustrating operation waveforms of sections of the semiconductor device according to the second exemplary embodiment.
Figure 5B:
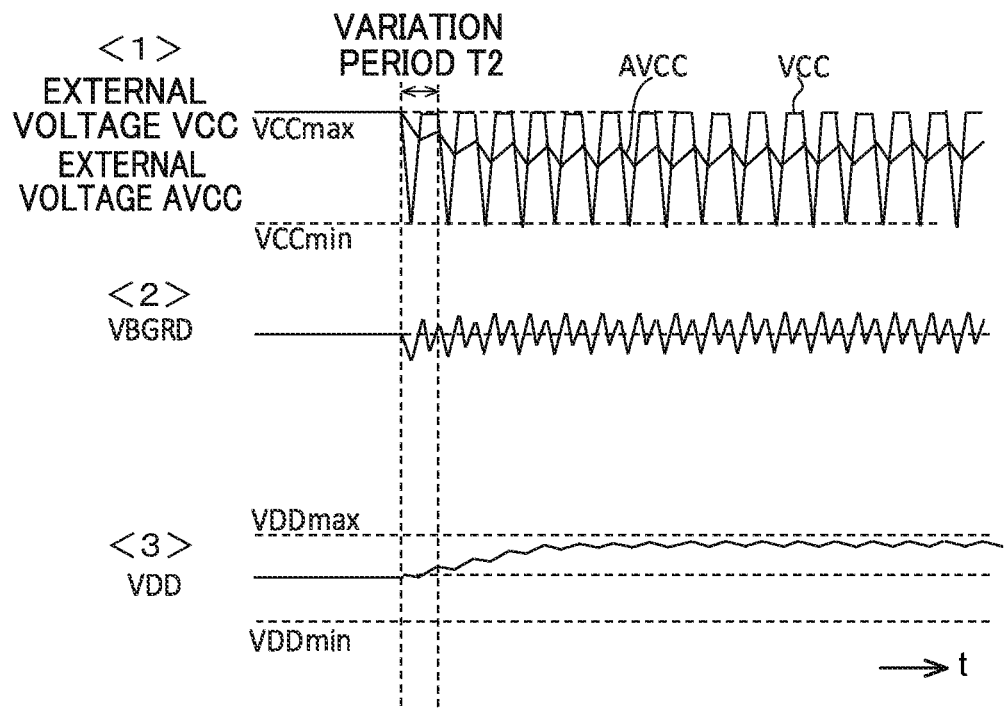

Now, operation of the semiconductor device 50A is described with reference to FIG. 5A and FIG. 5B. FIG. 5A and FIG. 5B are timing diagrams illustrating operation waveforms of sections of the semiconductor device 50A in response to variations of the external voltage VCC. FIG. 5A depicts a situation in which the lowpass filter 11 illustrated in FIG. 4A and FIG. 4B is omitted, and FIG. 5B depicts a situation in which the lowpass filter 11 is present. FIG. 5A and FIG. 5B each illustrate <1> waveforms of the external voltages VCC and AVCC, <2> a waveform of the reference voltage VBGRD, and <3> a waveform of the internal voltage VDD. As illustrated by waveform <1> in FIG. 5A and FIG. 5B, in the present example voltage variations with a relatively short duration of a variation period T2 repeatedly occur in the external voltage VCC (for example, T2 is a period of about 500 ns (nanoseconds)). A variation range of the external voltage VCC is a range between VCCmin and VCCmax.

As illustrated by waveform <1> in FIG. 5A, due to operation of the lowpass filter 54, variations in the external voltage AVCC are smaller than the variations of the external voltage VCC. However, even though the variations of the external voltage AVCC are smaller, variations still occur in the reference voltage VBGR that is the output of the bandgap circuit 51. Thus, as illustrated by waveform <2> in FIG. 5A, further oscillations caused by the response of the op amp 7 are superposed on the reference voltage VBGRD that is the output of the buffer circuit 52.

In a case in which the reference voltage VBGRD varies and the regulator circuit 53 is repeatedly subjected to the reference voltage VBGRD being higher than an average voltage, charge is repeatedly provided from the high current supply capability driver (not illustrated in the drawings) of the op amp 10, and the internal voltage VDD steadily rises. As illustrated by waveform <3> in FIG. 5A, in a case in which the internal voltage VDD exceeds the maximum tolerance voltage VDDmax, a component withstand voltage may be exceeded or circuit operations of a circuit being supplied with the step-down voltage may become unstable.

In contrast, in a case in which the lowpass filter 11 is present, operation is as follows. Because the reference voltage VBGRD passes through the lowpass filter 11, variations of the voltage at the output terminal VBGRD_OUT, which is the reference voltage of the regulator circuit 53, are small as illustrated by waveform <2> in FIG. 5B. In a case in which the high current supply capability driver (not illustrated in the drawings) of the op amp 10 is repeatedly subjected to the voltage of the output terminal VBGRD_OUT being higher than the average voltage thereof, the repeated periods in which charge is supplied from the driver, and charge supply rates, are smaller than in the situation of FIG. 5A. Therefore, as illustrated by waveform <3> in FIG. 5B, the rise of the internal voltage VDD may be suppressed so as not to exceed the maximum tolerance voltage VDDmax of the internal voltage VDD.

The voltage at the output terminal VBGRD_OUT is used only for charging the gate of a FET at an input stage of the op amp 10. Therefore, the current supply capability of the lowpass filter 11 may be small. Accordingly, the resistor value of the resistor 12 may be specified to be large. Thus, a circuit area of the lowpass filter 11 may be significantly reduced, which contributes to restraining layout area.

As described in detail above, according to the semiconductor device according to the present exemplary embodiment, even in a case in which voltage variations of the external voltage are repeatedly applied with relatively short durations, overshoot of the internal (step-down) voltage VDD may be suppressed even though a large increase in circuit area is suppressed. Therefore, the semiconductor device may be operated stably.

Third Exemplary Embodiment

The present exemplary embodiment is described with reference to FIG. 6, FIG. 7A and FIG. 7B. In a semiconductor device according to the present exemplary embodiment, the regulator circuit 53 of the semiconductor device 50A described above (see FIG. 4A) is replaced with a regulator circuit 53A, and the lowpass filter 11 is omitted. Accordingly, configurations that are the same as in the semiconductor device 50A are referred to with the same reference symbols and are not illustrated in FIG. 6.

Figure 6:
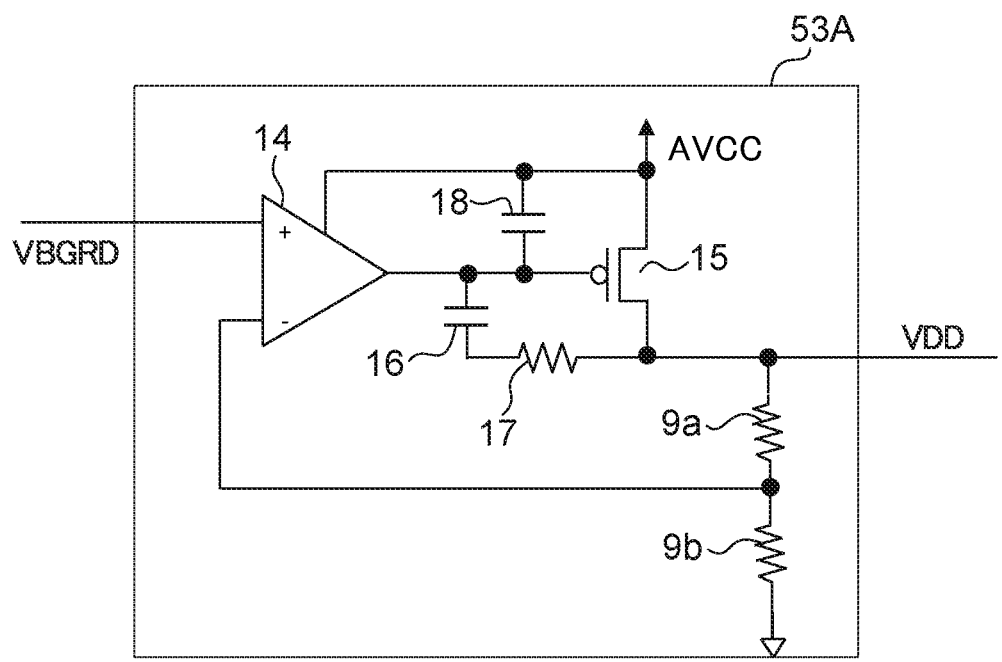
FIG. 6 is a circuit diagram illustrating configurations of a regulator circuit of a semiconductor device according to a third exemplary embodiment.

FIG. 6 illustrates a circuit diagram of the regulator circuit 53A according to the present exemplary embodiment. As illustrated in FIG. 6, the regulator circuit 53A is provided with a comparison circuit 14, a driver (PMOS) 15, capacitors 16 and 18, the resistors 9a and 9b and a resistor 17. The regulator circuit 53A inputs the reference voltage VBGRD (see FIG. 4A) and, using the drain of the driver 15 as an output terminal, outputs the internal voltage VDD.

The comparison circuit 14 is a comparator that compares the reference voltage VBGRD with a divided voltage, for which the internal voltage VDD is divided by the resistors 9a and 9b, and controls the gate of the driver 15 in accordance with results of the comparison. The capacitor 16 and the resistor 17 are provided for phase correction of a negative feedback circuit formed by the comparison circuit 14, the driver 15 and the resistors 9a and 9b. Functioning of the capacitor 18 is described below. In the regulator circuit 53, a PMOS, corresponding to the driver 15, is provided at an output stage. Therefore, the difference between the regulator circuit 53A and the regulator circuit 53 is the presence of the capacitors 16 and 18 and the resistor 17. As described below, the connection of the capacitor 18 is the reason for the capacitor 16 and resistor 17. Therefore, the effective difference is the presence of the capacitor 18.

Operation of the semiconductor device according to the present exemplary embodiment (below, "the present semiconductor device") is described with reference to FIG. 7A and FIG. 7B. FIG. 7A and FIG. 7B are timing diagrams illustrating operation waveforms of sections of the present semiconductor device in response to variations of the external voltage VCC. FIG. 7A depicts a situation in which the regulator circuit 53 illustrated in FIG. 4A and FIG. 4B is employed as the regulator circuit, and FIG. 7B depicts a situation in which the regulator circuit 53A illustrated in FIG. 6 is employed. FIG. 7A and FIG. 7B each illustrate <1> waveforms of the external voltages VCC and AVCC, <2> a waveform of the reference voltage VBGRD, and <3> a waveform of the internal voltage VDD. As illustrated by waveform <1> in FIG. 7A and FIG. 7B, in the present example variations with a relatively short duration of the variation period T2 repeatedly occur in the external voltage VCC (for example, T2 is a period of about 500 ns (nanoseconds)). A variation range of the external voltage VCC is a range between VCCmin and VCCmax.

As illustrated by waveform <1> in FIG. 7A and FIG. 7B, due to operation of the lowpass filter 54, oscillations of the external voltage AVCC are restrained to be smaller than oscillations of the external voltage VCC. Therefore, as illustrated by waveform <2> in FIG. 7A and FIG. 7B, oscillations of the reference voltage VBGRD are restrained to be smaller than the oscillations illustrated by waveform <2> in FIG. 5A. The above details are the same for both FIG. 7A and FIG. 7B.

For a regulator circuit with the purpose of maintaining the potential of an internal voltage VDD, particularly during standby (waiting) of a semiconductor device, the resistor values of the resistors 9a and 9b may be increased, the response speed of the comparison circuit 14 may be slowed, and current consumption may be reduced. In a case in which a regulator circuit with this purpose is exposed to a high-temperature environment or the threshold of the PMOS is lowered in fabrication processing, and then the reference voltage VBGRD varies and a voltage higher than the average value thereof is repeatedly applied, then even if, for example, oscillations of the reference voltage VBGRD are small, the driver 15 that is a PMOS may not turn OFF and the internal voltage VDD that is the output voltage thereof may steadily rise. This is illustrated by waveform <3> in FIG. 7A; the internal voltage VDD of the regulator circuit 53 follows this waveform.

In contrast, waveform <3> in FIG. 7B illustrates variations of the internal voltage VDD of the regulator circuit 53A. In the regulator circuit 53A, because the capacitor 18 is connected between the external voltage AVCC and the gate of the driver 15, the gate of the driver 15 rises in conjunction with a rise in the external voltage AVCC. Thus, the driver 15, being a PMOS, turns OFF. Therefore, the driver 15 that is a PMOS may be turned OFF directly irrespective of the response speed of the comparison circuit 14. Thus, as illustrated by waveform <3> in FIG. 7B, a rise in the internal voltage VDD that is the output of the driver 15 may be suppressed.

In a case in which a phase margin of the regulator circuit 53A is reduced by the connection of the capacitor 18, phase correction may be applied. The capacitor 16 and resistor 17 are provided for this phase correction. However, if the capacitor value of the capacitor 16 for phase correction is increased, a gate voltage sufficient to turn OFF the driver 15 that is a PMOS may not be obtained, because of capacitive coupling with the capacitor 18. In this situation, in order to restrain the capacitor value of the capacitor 16, it is sufficient to assure the phase margin by increasing the resistor value of the resistor 17 for phase correction.

As is described in detail above, according to the semiconductor device of the present exemplary embodiment, even in a case in which the semiconductor device is a regulator circuit of a low-power consumption type for standby (waiting) applications, overshooting of an internal (step-down) voltage VDD in a case in which external voltage variations with a relatively short period are repeatedly applied may be suppressed even though an increase in circuit area is suppressed.

In the exemplary embodiments described above, configurations according to the respective exemplary embodiments are individually described. However, as well as modes in which the exemplary embodiments of the present disclosure are individually applied, modes in which two or more of the exemplary embodiments described above are combined may be configured. For example, a mode applying all of the first to third exemplary embodiments is possible.

What is claimed is:

1. A reference voltage generation circuit comprising:
a first diode including a first conductive area;
a second diode including a second conductive area that is larger than the first conductive area;
a generation section configured to generate a reference voltage using a voltage based on the first diode and a voltage based on the second diode; and
a first capacitor connected between a node of dividing resistors and an output of the generation section, the dividing resistors being connected between the output of the generation section and the second diode.

2. The reference voltage generation circuit according to claim 1, further comprising a first resistor including one end connected to the first diode,
wherein the dividing resistors include a second resistor including one end connected to the second diode, and a third resistor including one end connected to the other end of the second resistor,
wherein the generation section includes an operational amplifier including first input terminal connected to a node between the first diode and the first resistor and second input terminal connected to a node between the second resistor and the third resistor, and a first field effect transistor including a gate connected to the output of the operational amplifier, and a drain connected to other end of the first resistor and to other end of the third resistor, the drain outputting the reference voltage, and
wherein the first capacitor is connected between the drain of the first field effect transistor and the node between the second resistor and the third resistor.

3. A semiconductor device comprising:
the reference voltage generation circuit according to claim 1;
a lowpass filter of which an input terminal is connected to an output of the reference voltage generation circuit; and
a voltage conversion section connected to an output terminal of the lowpass filter, the voltage conversion section configured to convert and output a voltage of an external power supply on the basis of the reference voltage generated by the reference voltage generation circuit.

4. A semiconductor device comprising:
the reference voltage generation circuit according to claim 1; and
a voltage conversion section configured to convert and output a voltage of an external power supply on the basis of the reference voltage generated by the reference voltage generation section, the voltage conversion section including a comparison circuit that compares an output of the reference voltage generation circuit with an output of the voltage conversion section, and a second capacitor connected between the external power supply and an output of the comparison circuit.

5. The semiconductor device according to claim 4, wherein:
the voltage conversion section further includes a second field effect transistor including a source connected to the external power supply, a gate connected to the output of the comparison circuit, and a drain that serves as an output of the voltage conversion section; and
the second capacitor is connected between the external power supply and the gate of the second field effect transistor.

6. The semiconductor device according to claim 5, wherein the voltage conversion section further includes a phase correction circuit connected between the gate and the drain of the second field effect transistor.

7. The semiconductor device according to claim 4, further comprising:
a buffer circuit connected to an output of the reference voltage generation circuit; and
a lowpass filter connected between an output of the buffer circuit and an input of the voltage conversion section.

* * * * *